(12) United States Patent  
Mittelholzer et al.

(10) Patent No.: US 8,930,803 B2
(45) Date of Patent: *Jan. 6, 2015

(54) DETECTING CODEWORDS IN SOLID-STATE STORAGE DEVICES

(71) Applicant: International Business Machines Corporation, Armonk, NY (US)

(72) Inventors: Thomas Mittelholzer, Zurich (CH); Nikolaos Papandreou, Thalwil (CH); Charalampos Pozidis, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 146 days.

This patent is subject to a terminal disclaimer.

(21) Appl. No.: 13/622,451

(22) Filed: Sep. 19, 2012

(65) Prior Publication Data

US 2013/0086457 A1    Apr. 4, 2013

(30) Foreign Application Priority Data

Sep. 29, 2011   (EP) ..................................... 11183336

(51) Int. Cl.
*H03M 13/51* (2006.01)
*G11C 11/56* (2006.01)

(52) U.S. Cl.
CPC .... *G11C 11/5678* (2013.01); *G11C 2211/5634* (2013.01); *G11C 2211/563* (2013.01)
USPC ...................................................... 714/806

(58) Field of Classification Search
CPC ............ G06F 11/1004; G06F 11/1032; G06F 11/1072; G11C 7/1006; G11C 11/5678; G11C 2211/563; G11C 2211/5634; G11C 11/5621; G11C 11/5642; G11C 16/349; G11C 16/28; G11C 29/00; G11C 11/5671; G11C 16/10; G11C 16/0475
See application file for complete search history.

(56) References Cited

U.S. PATENT DOCUMENTS

| | | | |
|---|---|---|---|
| 7,533,328 | B2 | 5/2009 | Alrod et al. |
| 7,747,549 | B2 | 6/2010 | Hoya |
| 7,787,307 | B2 | 8/2010 | Sarin |
| 7,814,401 | B2 | 10/2010 | Alrod et al. |
| 7,940,552 | B2 | 5/2011 | Chang-Wook et al. |

(Continued)

OTHER PUBLICATIONS

Papandreou, et al., "Programming algorithms for multilevel phase-change memory," Circuits and Systems (ISCAS), 2011 IEEE International Symposium on, pp. 329-332, May 15-18, 2011.

(Continued)

*Primary Examiner* — Guerrier Merant
(74) *Attorney, Agent, or Firm* — Jeff Tang

(57) ABSTRACT

A method for detecting codewords in solid-state storage devices. The method includes the steps of: obtaining respective read signals by reading memory cells that stores a group of codewords, where each of the read signals includes N signal components corresponding to respective symbols of the codeword; producing an ordered read signal by ordering the components of each of the read signals according to a signal level; producing an average read signal by averaging corresponding components of the ordered read signals; determining a reference signal level that corresponds to each of q levels of the memory cells in relation to the average read signal with predefined probabilities of each symbol value occurring at each symbol position in the codeword, where the symbols of the codeword are ordered according to the symbol value; and detecting the codeword corresponding to each of the read signal in relation to the reference signal levels.

15 Claims, 9 Drawing Sheets

(56) References Cited

U.S. PATENT DOCUMENTS

| | | |
|---|---|---|
| 7,944,744 B2 | 5/2011 | Bryant-Rich |
| 7,984,360 B2 | 7/2011 | Sharon et al. |
| 2010/0131826 A1 | 5/2010 | Shalvi et al. |
| 2011/0096594 A1 | 4/2011 | Franceschini et al. |
| 2011/0170349 A1 | 7/2011 | Avraham et al. |
| 2013/0166994 A1* | 6/2013 | Mittelholzer et al. ........ 714/805 |
| 2013/0227380 A1* | 8/2013 | Mittelholzer et al. ........ 714/807 |

OTHER PUBLICATIONS

Papandreou, et al., "Estimation of amorphous fraction in multilevel phase change memory cells," Solid State Device Research Conference, ESSDERC '09, pp. 209-212, Sep. 2009.

\* cited by examiner

Permutation Code

N=16, q=4, symbol values {0, 1, 2, 3}
Initial vector X0 = [0000111122223333]

Codewords:
{ [0000111122223333], [0001011122223333],

[0010011122223333], [0100011122223333],

⋮

[3333222211101000], [3333222211110000] }

} sequences of relative symbol values are unique

FIG. 3

| $c^{(j)}$ initial vectors | # $\Pi(c^{(j)})$ |
|---|---|
| $c^{(1)}$ = [ 0 1 1 2 3 3 ] | 630 |
| $c^{(2)}$ = [ 0 0 1 1 2 3 ] | 630 |
| $c^{(3)}$ = [ 0 0 0 1 2 3 3 ] | 420 |
| $c^{(4)}$ = [ 0 0 1 2 3 3 3 ] | 420 |

FIG. 4

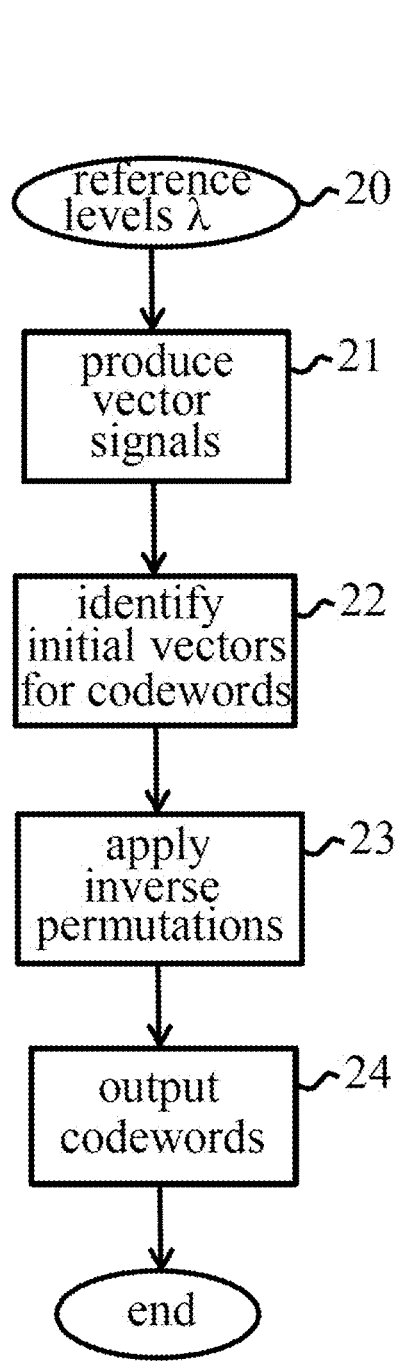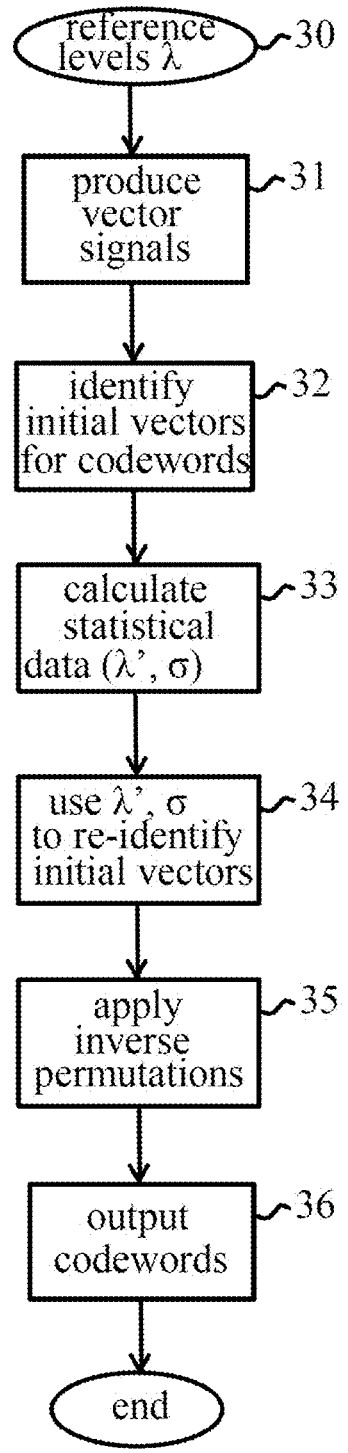
FIG. 5
FIG. 6

DETECTING CODEWORDS IN SOLID-STATE STORAGE DEVICES

CROSS-REFERENCE TO RELATED APPLICATION

This application claims priority under 35 U.S.C. §119 from European Patent Application No. 11183336.4 filed Sep. 29, 2011, the entire contents of which are incorporated herein by reference.

BACKGROUND OF THE INVENTION

1. Field of the Invention

This invention relates generally to read-detection in solid-state storage devices (SSSDs). More particularly to methods and apparatus for detecting codewords stored in multi-level memory cells on readout of solid-state memory.

2. Description of Related Art

In solid-state memory such as flash memory and phase change memory (PCM), the fundamental storage unit (the "cell") can be set to a number of different states or "levels", which exhibit different electrical characteristics. These different levels can be used to store information. To readout the stored information, cell-level is detected via measurements that differentiate the different levels by exploiting the differing electrical characteristics. In "single-level cell" (SLC) devices, the memory cells can be set to only two levels and can record only binary values. Other devices have "multi-level cells" which can be set to q different levels, where q>2. For instance, multi-level NOR flash memories can store 4 levels, i.e. 2 bits, per cell. Multi-level cell (MLC) NAND flash memory chips that can store 3 bits of data per single flash cell using 25 nm process technology are currently available. Storage of 2 bits per cell in PCM chips has also been demonstrated.

When writing information to multi-level cells, each cell can be used to store a q-ary symbol with each of the q possible symbol values being represented by a different cell level. On readout of multi-level cells, the read signal level is compared with a set of reference signal levels indicative of the q cell-levels in order to determine which level each cell is set to and thus detect the stored symbol value. However, a problem in multi-level SSSDs is that the physical quantity measured during cell readout, such as electrical resistance in PCM devices, is liable to drift. In particular, the electrical resistance of PCM cells drifts upwards with time in a stochastic manner. This drift can be data-dependent and can vary for different cell levels. As another example, in flash memory cells the physical quantity measured is the transistor's threshold voltage. This threshold voltage drifts upwards as a function of the number of write/erase cycles the cell is subjected to. Thus, for any given stored symbol value and cell level, the actual read signal level obtained on cell-readout can vary. In situations like this where the read signal level distributions for cell-levels vary, the reference signal levels used for level detection need to be varied as well (e.g. with time, with the number of write cycles, or etc.), in order to ensure reliable detection of stored symbols.

A number of techniques have been proposed to address the problem of drift. One technique involves use of a fraction of the memory as a reference. A pool of memory cells is reserved for system use, and an earlier known information is written to some of these cells each time a block of user data is written in memory. Every time the user file is read, the reference cells are also read. As the stored cell-levels are known for the reference cells, and these cells have experienced the same usage as the user cells, the reference cell readings can be used to derive estimates for the changing reference signal levels used for detection. The drawbacks of this "reference-cell" method include: the overhead it entails, which translates to a loss of memory capacity; the penalty in terms of controller complexity and latency due to the readout of the extra cells, and issues related to the management of the pool of reference cells, e.g. wear-leveling issues. Also, because drift is a statistical phenomenon and there is significant variability between cells in a memory array, reference cells can not be representative and the effectiveness of reference-cell based approaches can vary substantially with time and over different portions of the memory array.

Model-based drift cancellation techniques seek to model drift based on key parameters such as temperature, time and wear, and compensate accordingly. It is, however, difficult to obtain an accurate cell history for the key parameters. There are also fluctuations from cell to cell and there is no well-established analytical model available for short-term drift. A model-based approach using time-aware sensing is described in "Using Time-Aware Memory Sensing to Address Resistance Drift Issue in Multi-Level Phase Change Memory", Wei Xu at al., Proc. Int'l Symposium on Quality Electronic Design, 2010. The proposed system keeps track of elapsed time between writing and reading of memory cells and uses this to estimate, and compensate for, the impact of time-dependent drift.

A technique based on coding is detailed in our copending European Patent Application no. 10164495.3 (U.S. Patent Pub. No. 2011/0296274 A1). This technique encodes input data as N-symbol codewords of a so-called "translation-stable code". Each codeword symbol can take one of q symbol values and is recorded in a respective q-level cell by setting the cell-level in accordance with symbol value. The translation-stable code is such that each possible input data word is mapped by the coding scheme to a codeword with a unique sequence of relative symbol values. Such a code can be constructed, for example, from codewords in a set of one or more permutation codes, each codeword of a permutation code being a particular permutation of a predefined vector (the "initial vector") having N q-ary symbols arranged in order of increasing symbol value. In any case, with a translation stable code, information is effectively encoded in the relative, as opposed to the absolute, amplitudes of cell levels, and this feature imbues the scheme with a level of resistance to the effects of drift on detection accuracy.

Despite the previously-proposed measures, there is a need for improving read-detection techniques involving determination of reference signal levels for multilevel cell-levels that can be subject to drift effects.

SUMMARY OF THE INVENTION

Accordingly, one aspect of the present invention provides a method for detecting codewords in solid-state storage devices, the method including the steps of: obtaining, by a processor of the computer system, respective read signals by reading memory cells that stores a group of N-symbol codewords, where each of the read signals includes N signal components corresponding to respective symbols of the codeword; producing, by the processor, an ordered read signal by ordering the components of each of the read signals according to a signal level; producing, by the processor, an average read signal by averaging corresponding components of the ordered read signals; determining, by the processor, a reference signal level that corresponds to each of q levels of the memory cells in relation to the average read signal with predefined probabilities of each symbol value occurring at each symbol position in the codeword, where the symbols of the codeword are ordered according to the symbol value; and detecting, by the processor, the codeword corresponding to each of the read signal in relation to the reference signal levels; where each of the codewords is a permutation of an N-symbol vector in a predefined set of the N-symbol vectors; where each of the symbols of each the codeword has one of q symbol values; and where the symbols are stored in respective q-level cells of solid state memory, where $N \geq q > 2$.

Another aspect of the present invention provides an apparatus for detecting codewords in solid state storage devices, the apparatus including: a memory controller configured to obtain read signals by reading memory cells that store a group of codewords, where each of the read signal includes N signal components corresponding to the symbols of the codeword; and a codeword detector configured to: produce an ordered read signal by ordering the components of each of the read signals according to a signal level; produce an average read signal by averaging corresponding components of the ordered read signals; determine a reference signal level that corresponds to each of q levels of the memory cells in relation to the average read signal with predefined probabilities of each symbol value occurring at each symbol position in the codeword, where the symbols of the codeword are ordered according to the symbol value; and detect the codeword corresponding to each of the read signal in relation to the reference signal levels; where each of the codewords is a permutation of an N-symbol vector in a predefined set of the N-symbol vectors; where each of the symbols of each the codeword has one of q symbol values; and where the symbols are stored in respective q-level cells of solid state memory, where $N \geq q > 2$.

Another aspect of the present invention provides a solid-state storage device, including: a solid-state memory having q-level cells, where $q > 2$; a writing apparatus for writing N-symbol codewords in the solid-state memory where $N \geq q$; where each of the N-symbol codewords is a permutation of an N-symbol vector of a predefined set of the N-symbol vectors; where the each of the symbols of each the codeword has one of q symbol values; and where the symbols are stored in respective q-level cells; and a codeword detector configured to: produce an ordered read signal by ordering the components of each of the read signals according to a signal level; produce an average read signal by averaging corresponding components of the ordered read signals; determine a reference signal level that corresponds to each of q levels of the memory cells in relation to the average read signal with predefined probabilities of each symbol value occurring at each symbol position in the codeword, where the symbols of the codeword are ordered according to the symbol value; and detect the codeword corresponding to each of the read signal in relation to the reference signal levels.

BRIEF DESCRIPTION OF THE DRAWINGS

FIG. 3 indicates construction of an exemplary coding scheme according to an embodiment of the present invention.

FIG. 4 gives another example of a coding scheme according to an embodiment of the present invention.

FIG. 5 indicates steps of a first codeword detection method according to an embodiment of the present invention.

FIG. 6 indicates steps of a preferred codeword detection method according to an embodiment of the present invention.

DETAILED DESCRIPTION OF THE PREFERRED EMBODIMENTS

Figure 1:
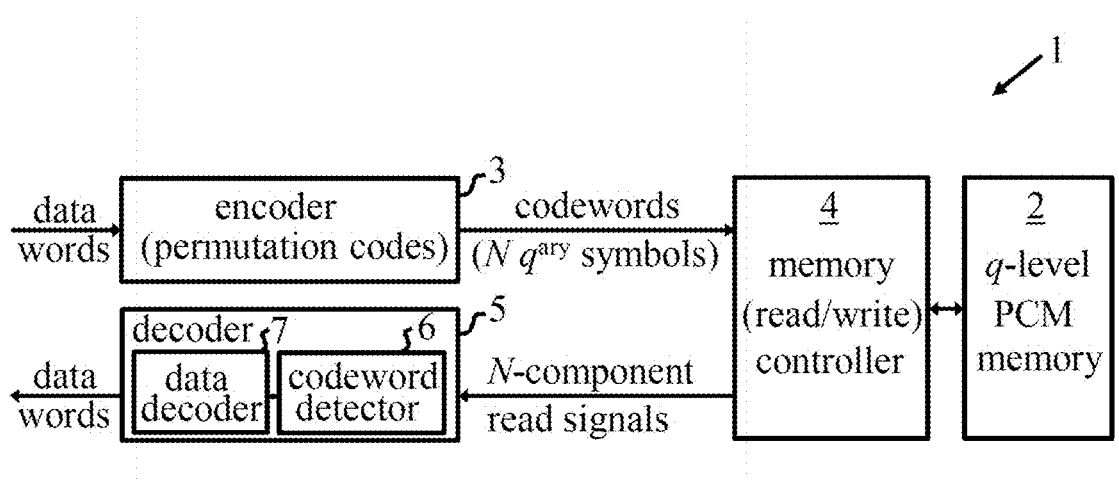
FIG. 1 is a schematic block diagram of a solid-state storage device according to an embodiment of the present invention.

The above and other features of the present invention will become more distinct by a detailed description of embodiments shown in combination with attached drawings. Identical reference numbers represent the same or similar parts in the attached drawings of the invention.

As will be appreciated by one skilled in the art, aspects of the present invention can be embodied as a system, method or computer program product. Accordingly, aspects of the present invention can take the form of an entirely hardware embodiment, an entirely software embodiment (including firmware, resident software, micro-code, etc.) or an embodiment combining software and hardware aspects that can all generally be referred to herein as a "circuit," "module" or "system." Furthermore, aspects of the present invention can take the form of a computer program product embodied in one or more computer readable medium(s) having computer readable program code embodied thereon.

Any combination of one or more computer readable medium(s) can be utilized. A computer readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium can be any tangible medium that can contain, or store a program for use by or in connection with an instruction execution system, apparatus, or device.

Computer program code for carrying out operations for aspects of the present invention can be written in any combination of one or more programming languages, including an object oriented programming language such as Java, Smalltalk, C++ or the like and conventional procedural programming languages, such as the "C" programming language or similar programming languages. The program code can execute entirely on the user's computer, partly on the user's computer, as a stand-alone software package, partly on the user's computer.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions can also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions can also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams can represent a module, segment, or portion of code, which includes one or more executable instructions for implementing the specified logical function(s). It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

One aspect of the present invention provides a method for detecting N-symbol codewords each being a permutation of an N-symbol vector of a predefined set of N-symbol vectors, where the symbols of each codeword, each of which has one of q symbol values, are stored in respective q-level cells of solid state memory where $n \geq q > 2$. The method includes: reading the memory cells storing a group of codewords to obtain respective read signals each including N signal components corresponding to respective symbols of a codeword; ordering the components of each read signal according to signal level to produce an ordered read signal; averaging corresponding components of the ordered read signals to produce an average read signal; determining a reference signal level corresponding to each of the q levels of the memory cells in dependence on the average read signal and predefined probabilities of occurrence of each symbol value at each symbol position in a said codeword whose symbols are ordered according to symbol value; and detecting the codeword corresponding to each read signal in dependence on the reference signal levels.

Read-detection methods embodying this invention provide for detection of N-symbol codewords stored in q-level memory cells where the overall coding scheme employs codewords which are permutations of a predefined set of N-symbol vectors. This set of vectors can in general include one or more vectors. Each q-ary symbol of a codeword is stored in a respective q-level cell in accordance with the predefined correspondence between symbol values and cell levels. A plurality of stored codewords are read at a time, and the resulting read signals for this group of codewords are then processed to determine current reference signal levels for the q cell-levels. These reference signal levels are then used in detecting the codewords in the group. The technique for determining the current reference signal levels exploits the inherent property of the codewords that all codewords are permutations of a smaller subset corresponding to the aforementioned set of vectors. In particular, knowledge of the set of vectors permits probabilities to be defined for the occurrence of each possible symbol value at each possible symbol position in a codeword whose symbols have been ordered according to symbol value. By ordering the read signal components according to signal level (e.g. in order of increasing signal level) and then averaging the resulting ordered read signals for the codeword group, an average read signal is obtained. The aforementioned probabilities can then be correlated with components of the average read signal to obtain reliable estimates for the current reference signal levels for the q-level cells. The set of reference signal levels derived from the group of codewords is then used in detection of those codewords. It will be seen that this technique is self-adaptive in that it uses the actual "user cells" (i.e. the cells storing encoded user data) for reference level estimation and detection. Good estimates of the appropriate reference levels can thus be obtained, and problems associated with use of "reference-cells" discussed above can be avoided. Eliminating the need for managing these extra system cells also permits much simpler implementation. Methods embodying the invention are also robust and amenable to fast implementation. Overall, therefore, methods embodying the invention offer significant performance advantages in multi-level cell storage devices.

It should be noted that a wide variety of codes fall within the overall requirements for operation of read-detection schemes embodying the invention. These encompass many codes of practical interest, including translation-stable codes described in our copending European patent application referenced above. Use of translation stable codes in preferred embodiments offers still further robustness against drift effects due to the inherent properties of these codes. However, reliable operation can be achieved with numerous other codes, and even uncoded data meets the basic requirements for operation. In particular, q-ary user datawords, which are not otherwise subjected to modulation coding, can be shown to be permutations of a smaller set of q-ary vectors, albeit containing a larger number of such vectors than the coding schemes used in preferred embodiments. In general, therefore, the N-symbol codewords detected in embodiments of the invention can represent modulation coded data or simply user datawords expressed in a q-ary alphabet.

The average read signal is produced by averaging corresponding components (i.e. the first, second, . . . , Nth components) of the ordered read signals in which the signal components have been ordered according to signal level, e.g. in order of increasing signal level, or decreasing signal level. To estimate the current reference signal levels, the average read signal is used together with the predefined probabilities. These represent probabilities of occurrence of each symbol value at each symbol position in a codeword whose symbols are ordered according to symbol value. (Note that there can, in general, be an arbitrary mapping of symbol values to cell levels, and this mapping can be reflected in the ordering of codeword symbols to correspond to the ordering of the read signal level components). Conveniently, the symbols of each said vector are similarly ordered according to symbol value. The aforementioned probabilities are then dependent on the symbol values at each symbol position in the set of vectors. If there is only one vector in the set (and no other factors affect, or are deemed to affect, probability distributions) then the probabilities used here can be simply 0 or 1 as defined directly by the symbols of the sole vector. However, in preferred embodiments the coding scheme is based on permutations of a plurality of vectors. In this case the probabilities are also dependent on the number of valid codewords which are permutations of each vector. While other factors can be considered in defining the probabilities, the structure of the vectors, and the numbers of their permutations, are sufficient to define the probabilities in preferred embodiments. Good results are achieved with such embodiments as demonstrated below.

Various techniques can be envisaged for detecting the codewords in dependence on the current reference signal levels derived for the codeword group. Preferred embodiments use the reference signal levels to identify the vector to which each codeword read signal corresponds. Particularly preferred embodiments use the reference level estimates as initialization values for a second estimation stage of the detection process. Here, statistical data is derived for the level distributions obtained using the initial reference level estimates. This statistical data includes updated reference level estimates and is used in a further step where the vector to which each codeword read signal corresponds is identified again. In these various preferred techniques, codeword detection can be performed by applying an inverse permutation to the vector identified for a given codeword, the inverse permutation being the inverse of the permutation of the read signal producing the ordered read signal for that codeword. These techniques and their various advantages will be discussed in detail below.

A second aspect of the invention provides apparatus for detecting N-symbol codewords each being a permutation of an N-symbol vector of a predefined set of N-symbol vectors, where the symbols of each codeword, each of which has one of q symbol values, are stored in respective q-level cells of solid state memory where $N \geq q > 2$. The apparatus includes a memory controller for reading the memory cells storing a group of codewords to obtain respective read signals each including N signal components corresponding to respective symbols of a codeword, and a codeword detector including control logic adapted to: order the components of each read signal according to signal level to produce an ordered read signal; average corresponding components of the ordered read signals to produce an average read signal; determine a reference signal level corresponding to each of the q levels of the memory cells in dependence on the average read signal and predefined probabilities of occurrence of each symbol value at each symbol position in a said codeword whose symbols are ordered according to symbol value; and detect the codeword corresponding to each read signal in dependence on the reference signal levels.

The invention also provides a solid-state storage device including: solid-state memory having q-level cells, where $q > 2$; write apparatus for writing N-symbol codewords in the solid-state memory where $N \geq q$, each of the N-symbol codewords being a permutation of an N-symbol vector of a predefined set of N-symbol vectors, where the symbols of each codeword, each of which has one of q symbol values, are stored in respective q-level cells; and apparatus according to the second aspect of the invention for detecting the codewords on reading of the memory.

FIG. 1 is a simplified schematic of a solid-state storage device, here a phase-change memory (PCM) device 1, embodying the invention. The device 1 includes phase-change memory 2 for storing data in one or more integrated arrays of multilevel PCM cells. Though shown as a single block in the figure, in general memory 2 can include any desired configuration of PCM storage units ranging, for example, from a single chip or die to a plurality of storage banks each containing multiple packages of storage chips. Write apparatus of device 1 includes an encoder 3 for encoding input user data and a memory controller 4 which controls writing of the resulting codewords in memory 2. The encoding scheme implemented in encoder 3 is based on permutation codes as discussed below. The device read apparatus also involves memory controller 4 for reading the appropriate cells in memory 2, and a decoder 5 for processing the resulting read signals. Decoder 5 includes a codeword detector 6 which detects codewords corresponding to the received read signals, and a data decoder 7 which decodes the codewords to recover the original user data.

Each of the PCM cells in memory 2 can be set to one of $q > 2$ nominal levels designated $I_0$ to $I_{q-1}$ herein. Memory controller 4 can set a cell to a particular level by adjusting the resistance of the cell in known manner. In particular, levels $I_0$ to $I_{q-1}$ correspond to respective values in a sequence of successively-higher resistance values defined in controller 4. To read a cell, controller 4 applies a small probing signal to obtain a readback signal indicative of the cell's resistance. During write and read operations, controller 4 addresses individual cells in known manner by applying appropriate voltage signals to an array of word and bit lines in memory ensemble 2.

In operation, the input data to be recorded in memory 2 is supplied to encoder 3. The encoder 3 encodes each input data word as a respective codeword which is output to memory controller 4. The codewords each have N q-ary symbols $s_n$, n=1, 2, ..., N, where N≥q. Hence, the symbols of a codeword can each take one of q possible values ($s_n \in \{0, 1, ..., q-1\}$). The encoding scheme is such that every codeword generated by encoder 3 is a permutation of an N-symbol vector from a predefined set of N-symbol vectors. Such an encoding scheme can be based on permutation codes. A permutation code is characterized by a real vector of length N (the "initial vector") on which the permutation group of N letters operates. The code is completely determined by its length N and the initial vector X0 which has N components (symbols). The codewords consist of all length N vectors that are obtained through a permutation of the components of the initial vector. The overall encoding scheme can utilize one or more such permutation codes, though in preferred embodiments the encoding scheme is based on a union of permutation codes. That is, the set of valid codewords for the overall code consists of all, or a subset of, the codewords in a plurality of permutation codes. The aforementioned set of vectors then contains the initial vectors of these permutation codes. Particular examples of such codes are given below.

The q possible symbol values of the codewords from encoder 3 correspond to respective predetermined levels $I_0$ to $I_{q-1}$ of the q-level cells in memory 2. That is, there is a predefined correspondence between symbol values and cell levels. (While in theory any arbitrary mapping of symbol values to cell levels is possible, the mapping is preferably order-preserving for the sake of simplicity. In this example, a direct correspondence between symbol values 0, 1, ..., q-1 and cell levels $I_0$ to $I_{q-1}$ is assumed, so that symbol value 0 maps to cell level $I_0$, symbol value 1 maps to cell level $I_1$, and so on). Controller 4 stores the N symbols of each codeword output by encoder 3 in respective cells of memory 2 by setting each cell to the level corresponding to the symbol value. Note that, when setting a cell to a given level, the actual resistance value x assumed by the cell can lie within a small interval around the nominal resistance value I for the level due to write noise.

Blocks of codewords are written/read substantially simultaneously to memory by memory controller 4. In this embodiment, controller 4 writes/reads groups of B codewords in parallel so that the codewords in each group are written/read at the same time instants. In a read operation, the memory cells storing a group of B codewords are read to obtain B real-valued read signals y each having N signal components $y_n$, n=1, 2, ..., N, indicating the read-back resistance values of the sequence of cells storing the N symbols of a codeword. The signal components $y_1, ... y_N$ of each read signal thus correspond to respective symbols of a codeword. The read signals y are supplied to decoder module 5 where codeword detector 6 detects the codeword corresponding to each read signal by a process detailed below. Data decoder 7 then decodes the detected codewords by performing the inverse of the dataword-to-codeword mapping performed in encoder 3, thus recovering the original input data.

In general, functionality of encoder 3 and decoder 5 can be implemented in hardware, software or a combination thereof. For example, the mapping of input data words into codewords in encoder 3 can be implemented using a look-up table, in particular for small codes, or using the well-known technique of enumerative source coding for more efficient operation with large codes. Data decoder 7 can be implemented in corresponding manner to perform the inverse of the coding process. The codeword detector 6 includes control logic for implementing the various steps of the codeword detection process detailed below, and this control logic can be embodied in hardware or software or a combination of hardware and software components. Though the detection processes will be described in terms of a series of separate steps, functionality associated with different steps can be provided by a single component of the control logic, and a plurality of components can be involved in performance of any particular step. For example, one or more of the steps can be performed in whole or in part by software which configures a processor to implement the functionality described, and suitable software will be readily apparent to those skilled in the art. For reasons of operating speed, however, the use of hardwired logic circuits is generally preferred to implement detector functionality as far as possible. Again, suitable implementations will be readily apparent from the description of operation herein.

As indicated above, the signal components $y_1, ... y_N$ of each read signal output by memory controller 4 correspond to respective symbols $s_1, ... s_N$ of a stored codeword. The read-back resistance levels y corresponding to a given symbol value s are variable due to drift and noise effects. Drift is of stochastic nature and is modeled here as a deterministic part f (average trend due to drift) and a stochastic part g (drift and noise) which is data-dependent:

$$y=f(x,t)+g(x,t),$$

where y is the drifted level, x is the original stored value, t is time, f(x,t) is a monotonic function of x for all fixed t (i.e. levels maintain their order over time), and g(x,t) is a random process capturing the data-dependent nature of noise. For fixed x and t, additive noise is modeled as Gaussian with zero mean and data-dependent variance:

$$g(x,t) \sim N(0,\sigma(x)).$$

Hence, the readback resistance level distributions shift in time, with changing means and potentially variances, and are level-dependent, having data-dependent means and variances. For accurate detection of codewords from read signals y, codeword detector 6 must account for the variable resistance level distributions. Most fundamentally, in order to correlate read signal components $y_n$ with symbol values $s_n$, the codeword detector must estimate appropriate reference signal levels which correspond to the different cell levels $I_0$ to $I_{q-1}$, and hence to the different symbol values, for the read operation. These reference signal levels can then be used for codeword detection. An overview of the codeword detection process is given below with reference to the flow diagram of FIG. 2. For the ensuing description, we assume that encoder 3 employs an exemplary code being a union of L permutation codes defined by the L initial vectors $c^{(1)}, c^{(2)}, ..., c^{(L)}$, each of length N, whose symbols are ordered in order of increasing symbol value. The symbols of any given codeword can take one of q symbol values as described above (though not all of the q values need appear in all initial vectors).

Figure 2:
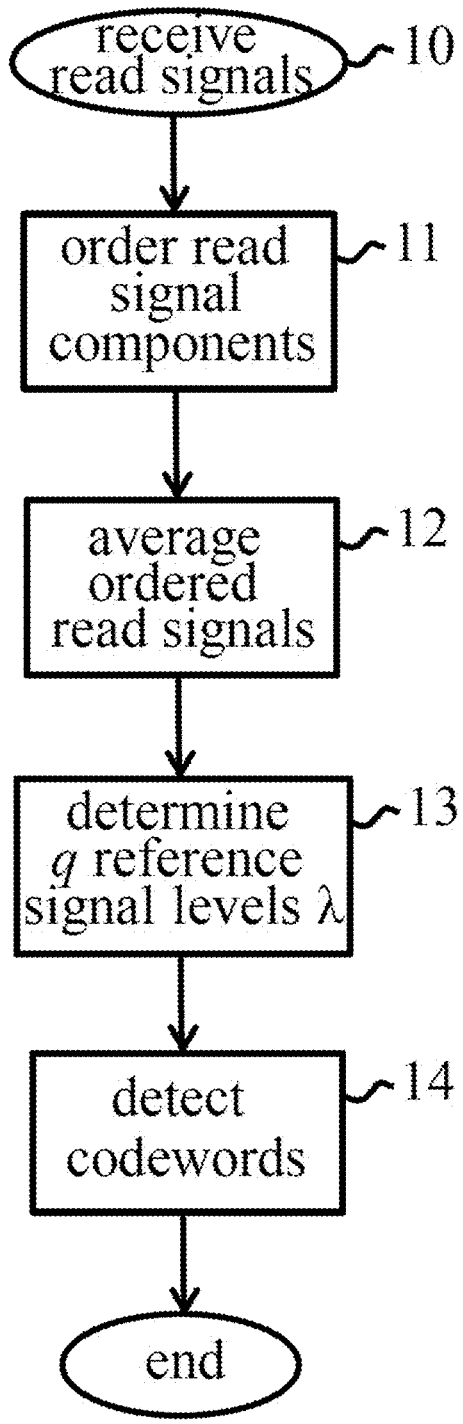
FIG. 2 indicates key steps in operation of a codeword detector according to an embodiment of the present invention.

FIG. 2 indicates the main operational steps performed by codeword detector 6. As indicated at step 10, detector operation commences on receipt of a group of B read signals y from memory controller 4 corresponding to a group of B codewords read from memory 2. The read signals y are temporarily stored in codeword detector 6 for use in the subsequent processing operation. Next, in step 11, the control logic of detector 6 orders the components $y_1$ to $y_N$ of each read signal y according to signal level. In particular, the read signal components are ordered in order of increasing signal level (reflecting the symbol order of the initial vectors here), to produce a group of B ordered read signals $z^i$:

$$z^i = [y_{k_1}^i, y_{k_2}^i, ..., y_{k_N}^i], y_{k_1}^i \leq y_{k_2}^i \leq ... \leq y_{k_N}^i, \text{ where}$$
$$i=1, ..., B.$$

This ordering process defines a permutation ($k_1$ to $k_N$) of the signal components for each read signal y. The resulting ordered read signals, and their associated permutations, are stored in codeword detector 6 for use in later process steps. Next, in step 12, the detector logic averages corresponding components of the ordered read signals to obtain an "average" read signal $\bar{z}$ at time t:

$$E = [z_1 \ldots z_N], z_n = \frac{1}{B}\sum_{t=1}^{B} y_{k_n}^t, n=1, \ldots, N \qquad (1)$$

Thus, the first, second, ..., Nth components of the ordered read signals are averaged over the B signals to produce the average read signal $\bar{z}$. (A straightforward, unweighted averaging process is performed for simplicity in this example, though a weighted average can be envisaged for other embodiments if desired). In step 13, the detector logic determines a current reference signal level $\lambda$ corresponding to each of the q levels of the memory cells. For the q nominal cell levels $I_0$ to $I_{q-1}$ at time t=0, the corresponding drifted levels at time t are denoted by $\lambda_0$ to $\lambda_{q-1}$. These reference signal levels $\lambda_0$ to $\lambda_{q-1}$ are calculated in detector 6 using the average read signal $\bar{z}$ and a set of probabilities which are predefined in detector 6 based on the particular code C employed in encoder 3. These specify the probabilities of occurrence of each possible symbol value at each symbol position in a codeword, whose symbols are ordered according to symbol value. In particular, considering the ordered code $C^o$, in which all codewords $X=[X_1, X_2, \ldots, X_N] \in C$ have been replaced by their ordered versions $X^o$, where:

$$X^o = [X_{k1}, X_{k2}, \ldots, X_{kN}] \text{ with } X_{k1} \leq X_{k2} \leq \ldots \leq X_{kN}.$$

In turn, the stochastic (N×q)-matrix $P=[\rho_{nm}]$ is defined as:

$$\rho_{nm} = \text{prob } \{X^o_n = S_m\}, \text{ where}$$

n=1 to N, m=0 to q-1, and $S_1, S_2, \ldots, S_{q-1}$ are the symbol values 0, 1, ..., and q-1 respectively. Such a matrix can be defined for any code C based on the known code structure, i.e. the set of valid codewords defining the code. A particular example for a union of permutation codes will be described in detail below.

If, at each memory-write operation, B codewords are selected randomly from the code and written simultaneously to the PCM array as described above, the recorded signals x=[x1, x2, ..., xn] for the B codewords (if rearranged as their ordered versions xo=[xk1, xk2, ..., xkn] with xk1≤xk2≤ ... ≤xkn) satisfy:

$$\frac{1}{B}\sum_{t=1}^{B} x^{(t)oT} = P[l_0, \ldots, l_{q-1}]^T + (\text{error vector}), \qquad (2)$$

where $x^{(t)o}$ is the set of ordered write signals and the superscript T denotes the vector transpose. Note that if all codewords are used the error vector is essentially zero. On readback, the resulting read signals y are ordered and averaged as described in steps 11 and 12 of FIG. 2. The original nominal cell levels $l_0, \ldots, l_{q-1}$ have drifted over time and the levels $\lambda_o$ to $\lambda_{q-1}$ at time t are given by $\lambda_m = f(l_m, t), m=0, \ldots, q-1$. As f(.) is monotonic, the same stochastic matrix P defined above gives a relation analog to (2) between the levels $\lambda_m$ and the components of the average read signal $\bar{z}$. In particular, when subject to the channel distortion y=f(x, t)+g(x, t) as defined earlier, the average read signal $\bar{Z}$ satisfies:

$$\bar{z}^T = P[\lambda_0, \lambda_1, \ldots, \lambda_{q-1}]^T + e, \qquad (3)$$

where, if the group B consists of all codewords, the error e is the average (component by component) of the zero-mean noise samples vector g, which is expected to be essentially zero. Equation (3) represents an over-determined system of N linear equations which can be solved in known manner for the q unknowns $\{\lambda_0, \lambda_2, \ldots, \lambda_{q-1}\}$. A particular example of this process of a union of permutation codes is given below.

Returning now to FIG. 2, having determined the current reference signal levels $\lambda_0$ to $\lambda_{q-1}$ in step 13 of the process, the detector uses these reference levels in step 14 to detect the codewords corresponding to the current group of B read signals y. This can be done in various ways and particular examples are described in detail below. The codeword detection operation is then complete.

The process of determining reference levels $\lambda$ in step 13 of FIG. 2 will now be illustrated for a preferred embodiment where the code C is a translation-stable code. Translation-stable codes are defined and described in U.S. Patent Pub. No. 2011/0296274 A1, the relevant content of which is incorporated herein by reference. Briefly, however, with a translation-stable encoding scheme, each data word in the set of all possible input data words is encoded as a codeword with a unique sequence of relative symbol values. This can be understood by considering the simple translation-stable code of FIG. 3. This code is a permutation code with N=16 and q=4. Hence, codewords have sixteen 4-ary symbols with possible values 0, 1, 2, 3. Such a code can therefore be used with memory 2 having 4-ary cells. The initial vector X0 in this example is as shown in the figure. The set of codewords $\{c\}$ for the code C consists of all possible permutations of the initial vector X0 as indicated in the figure. There are $16!/24^4$ of these codewords, whereby the code has a rate of 1.62 bits/dimension (i.e. bits/cell). Inherent in this code is that each of these codewords has a unique sequence of symbol values relative to the lowest symbol value in the codeword, whereby adding any real-valued number to all symbol values in a codeword does not result in another codeword. In particular, if we define the translation vector t=[1 1 1 ... 1] of length N, here 16, then for all codewords c in the code C:

$$(c+Rt) \cap C = c \qquad (4)$$

where R is the set of real numbers. This provides the definition of a "translation-stable" code herein for any N-symbol, q-ary alphabet code $C \subseteq \{0, 1, \ldots, q-1\}^N \subseteq R^N$. With such codes, because each possible dataword maps to a codeword with a unique sequence of relative symbol values, input data is effectively encoded in the relative, as opposed to the absolute, symbol values. The correspondence between symbol values and memory cell levels means that codewords will be recorded as correspondingly unique sequences of relative levels in memory 2. A fixed shift in all levels does not change the relative level sequences and hence does not affect the information recorded. By detecting the relative level sequences on read-back, the correct codewords and hence data words can be recovered regardless of any drift-induced shift in the cell levels corresponding to a translation by $\mu \cdot [1\ 1\ \ldots\ 1], \mu \in R$ as defined above. The recording system is thus resistant to this "type [1 1 ... 1] drift".

While FIG. 3 shows a single permutation code, other translation-stable coding schemes can be based on a plurality of such codes. In particular, the set of codewords defining the code C can be selected from the codewords of a plurality of permutation codes so as to satisfy the translation-stable requirement defined by equation (4) above. More specifically, given a translation-stable code C we define L unique initial vectors $c^{(1)}, \ldots, c^{(L)}$, each of which has lexicographically-ordered components $c_1^{(j)} \leq c_2^{(j)} \leq \ldots \leq c_N^{(j)}$, such that the translation-stable code C for use in encoder 3 is contained in the union of the corresponding permutation modulation codes, i.e.:

$$C \subset \Pi(c^{(1)}) \cup \Pi(c^{(2)}) \ldots \cup \Pi(c^{(L)}) \qquad (5)$$

where $\Pi(c^{(j)})$ denotes the permutation modulation code with initial vector $c^{(j)}$ and $C \cap \Pi(c^{(j)}) \neq \emptyset$.

FIG. 4 illustrates the construction of a preferred translation-stable code, with q=4 and N=7, for use in device 1. The code is based on the union of four permutation modulation codes with initial vectors $c^{(j)}$ shown in the figure. There are 2100 codewords, consisting of a number of permutations of each initial vector as indicated by $\#\Pi(c^{(j)})$. Assuming all codewords are equally likely, then the probabilities defining the probability matrix P described above depend on the structure of the initial vectors and the number $\#\Pi(c^{(j)})$ of codewords which are permutations of each vector. In particular, the probabilities $p_j (j=1, \ldots, L)$ of occurrence of the initial vectors $c^{(j)}$ can be easily calculated as:

$$p1 = p2 = 63/210;$$

$$p3 = p4 = 42/210.$$

If we denote the initial vectors at time t as $$u^{(j)} = F\{c^{(j)}\} = [u_1^{(j)}, \ldots, u_n^{(j)}], j=1, \ldots, L$$

then, based on equation (1) above, the components $z_n$ of the average read signal can be expressed as:

$$z_n = \frac{1}{B} \sum_{i=1}^{B} y_{k_n}^i = \sum_{j=1}^{L} p_j u_n^{(j)} + e_n, n = 1, \ldots, N \qquad (6)$$

This equation can be rewritten in matrix form, corresponding to equation (3) above, as:

$$\bar{z} = P \cdot \lambda \qquad (7)$$

where $\bar{z} = [z_1, \ldots, z_N]^T$, and $\lambda = [\lambda_0, \lambda_1, \ldots, \lambda_{q-1}]^T$ is the vector of reference signal levels at time t. The matrix P is thus defined by the probabilities of occurrence of the initial vectors and the symbol values at each symbol position in the initial vectors. In particular, correlating the symbol values 0 to 3 in the FIG. 4 vectors with reference levels $\lambda_0$ to $\lambda_3$ via equation (7) gives:

$$(p_1 + p_2 + p_3 + p_4) \cdot \lambda_0 = z_1$$

$$(p_2 + p_3 + p_4) \cdot \lambda_0 + p_1 \cdot \lambda_1 = z_2$$

$$\ldots$$

$$(p_1 + p_2 + p_3 + p_4) \cdot \lambda_3 = z_7.$$

As N≥q, this set of linear equations can be solved in known manner for the unknown reference levels $\lambda_0, \ldots, \lambda_3$. In this preferred embodiment, detector 6 solves the equations using a least-squares method as is well known to those skilled in the art.

In some embodiments, the reference signal levels $\lambda_0$ to $\lambda_3$ can be used directly for codeword detection by comparing the components $y_n$ of each read signal y with these levels to identify the particular cell level, and hence symbol value, to which each read signal component corresponds. However, preferred embodiments offer improved detection accuracy by using the reference signal levels $\lambda_0$ to $\lambda_3$ to identify the initial vector of which the codeword corresponding to each read signal is a permutation. In effect, the read signals are divided into clusters, each cluster containing read signals representing codewords which are permutations of the same initial vector. Examples of such techniques will now be described with reference to FIGS. 5 and 6.

FIG. 5 shows the main steps in a first codeword detection process which can be performed by codeword detector 6. The operation commences at step 20 with determination of the current reference signal levels $\lambda_0$ to $\lambda_{q-1}$ as already described. Next, in step 21, the detector produces a vector signal corresponding to each initial vector by replacing each symbol of the vector by the reference signal level λ corresponding to the symbol value. That is, each initial vector $c^{(j)}$ is mapped to its counterpart $u^{(j)}$ at time t with real physical quantities (the reference signal levels λ) as components:

$$c^{(j)} \rightarrow F\{c^{(j)}\} = u^{(j)} = [u_1^{(j)}, \ldots, u_N^{(j)}], j=1, \ldots, L.$$

That is, the i-th component $c_i^{(j)}$ of $c^{(j)}$ is mapped into $u_i^{(j)}$ using the current reference level estimates $\lambda_m = f((l_m, t), m=0, 1, \ldots, q-1$. The resulting vector signals $u^{(j)}$ are then used to divide the group of B ordered read signals $z^i$ (from step 11 of FIG. 2) into clusters corresponding to respective initial vectors $c^{(j)}$. Specifically, in step 22, the initial vector of which the codeword corresponding to each ordered read signal $z^i$ is a permutation is identified by determining which vector signal $u^{(j)}$ is closest to that ordered read signal:

closest initial vector $c^{(r)} = [c_1^{(r)}, \ldots, c_N^{(r)}], r = \arg\min_j \{|z^i - u^{(j)}|\}$, where j=1, . . . , L. The minimum can be assessed here using any convenient minimum distance criterion, e.g. using a simple Euclidean distance metric.

Having effectively assigned each ordered read signal $z^i$ (and hence corresponding read signal y) to a cluster according to the initial vector identified in step 22, in step 23 the detector logic can detect the codeword corresponding to each read signal by applying an inverse permutation to the initial vector identified for the read signal. For a given read signal, the inverse permutation is simply the inverse of the permutation ($k_1$ to $k_N$) of that read signal which produced the ordered read signal in step 11 of FIG. 2. The resulting codeword for each of the group of B read signals is then output by codeword detector 6 in step 24 of FIG. 5. (Note that, if some operational error results in detection of an invalid codeword here then detector 6 simply outputs an erasure symbol for that codeword. This can be addressed by some suitable error-correction processing in data decoder 7. Such processes are well known to those skilled in the art and need not be addressed here). The codeword detection process is then complete.

The codeword detection technique of FIG. 5 is independent of any particular drift model and offers sufficiently accurate detection for some applications. Codeword-error-rate performance is fundamentally dependent on the minimum distance inherent in the code C, and this distance can be traded-off with code rate as required. This simple technique is increasingly reliable as the number B of codewords in a group increases, ensuring "good" representation of initial vectors in the batch of B codewords. The technique does not account for data-dependent noise however. A particularly preferred detection technique, which is less sensitive to such issues, will now be described with reference to FIG. 6.

The FIG. 6 operation commences at step 30 with determination of the current reference signal levels $\lambda_0$ to $\lambda_{q-1}$ as before. Steps 31 and 32 of the process are identical to steps 21 and 22 of FIG. 5, whereby detector 6 clusters the read signals according to the initial vector for the corresponding codewords. In step 33, the detector logic calculates statistical data for the distribution of the read signal component levels corresponding to each of the q nominal levels of the memory cells. In particular, by correlating the ordered read signal components with the symbols of the initial vectors in the various clusters, the read signal level distributions for each of the q cell-levels are obtained. These distributions are then processed to obtain the means and variances in each case. The mean values so obtained for the q cell-levels are denoted by $\lambda'_0$ to $\lambda'_{q-1}$ and represent updated values for the reference signal levels $\lambda$ used in initial clustering step 32. The variances for each level distribution are denoted by $\sigma$. In step 34 of FIG. 6, the detector logic uses the means $\lambda'$ and variances $\sigma$ in a second pass of the clustering operation initially performed in step 32. Hence, the initial vector to which each ordered reads signal corresponds is again identified, this time using the statistical data ($\lambda'$, $\sigma$) for the level distributions. This process is preferably based on one of a maximum-a-posteriori (MAP) detection method and a maximum-likelihood (ML) detection method, such methods being well known to those skilled in the art. In this example, the closest initial vector $c^{(r)}$ for each ordered read signal $z^i$ is identified as:

$$c^{(r)} = [c_1^{(r)}, \ldots, c_N^{(r)}], r = \arg\max_j \{Pr(z^i \mid c^{(j)})\},$$

where (j=1, ..., L); and
an ML technique being employed as:

$$Pr(z^i \mid c^{(u)}) = \left(\frac{1}{\prod_{n=1}^{N} 2\pi(\sigma_n^v)^2}\right)^{\frac{1}{2}} \exp\left[-\frac{1}{2}\sum_{n=1}^{N}\left(\frac{z_n^i - \mu_n^{(v)}}{\sigma_n^{(v)}}\right)^2\right], \text{ where:} \quad (8)$$

$z_n^i$ are the components $z_1^i, z_2^i, \ldots, z_N^i$ of ordered read signal $z^i$;

$\mu_n^{(v)}$ corresponds to initial vector $c^{(v)}$ with symbols replaced by the corresponding mean reference levels $\lambda'$; and $\sigma_n^{(v)}$ represents the standard deviation of the distribution for the reference level with mean $\lambda'$ which corresponds to each component of $\mu_n^{(v)}$.

Having effectively re-clustered the read signals y according to the initial vector identified using the statistical data in step 34, the subsequent steps 35 and 36 correspond to steps 23 and 24 of FIG. 5. Hence, detector 6 detects the codewords in step 35 by applying the appropriate inverse permutations to the initial vector identified for the read signals in each cluster, outputting the detected codeword (or an erasure symbol) in step 36. The process is then complete.

It will be seen that the process of FIG. 6 involves two-stages of an iterative clustering technique in which the first reference level estimates $\lambda$ (from step 13 of FIG. 2) are used as initialization values. Compared to known clustering techniques such as k-means clustering and expectation maximization, the FIG. 6 process represents a significant improvement. For example, the known techniques generally need several iterations to converge to a good solution, adding to latency in the application in question. Moreover, known methods are liable to converge to erroneous solutions (local minima) unless properly initialized. In contrast, the FIG. 6 process is based on a well-defined initialization that prevents convergence to an erroneous solution. It also converges in two steps: the first corresponding to step 32 and the second (step 34) giving the final solution. The technique is therefore guaranteed to be robust to initial conditions, and also fast, converging to the final solution in two iterations. In addition, the FIG. 6 process is independent of underlying drift characteristics (as long as drift does not reorder the resistance levels). It also accounts for data-dependent noise, and is less sensitive to small groups B than the FIG. 5 process.

It will be appreciated that the detection techniques described above obviate the problems associated with prior techniques based on reference cells, and are self-adaptive in that the actual user cells from which codewords are read are used for reference level estimation and detection of those codewords. The techniques are also amenable to simple, fast implementation, and offer improved performance compared to prior systems.

Figure 7A:
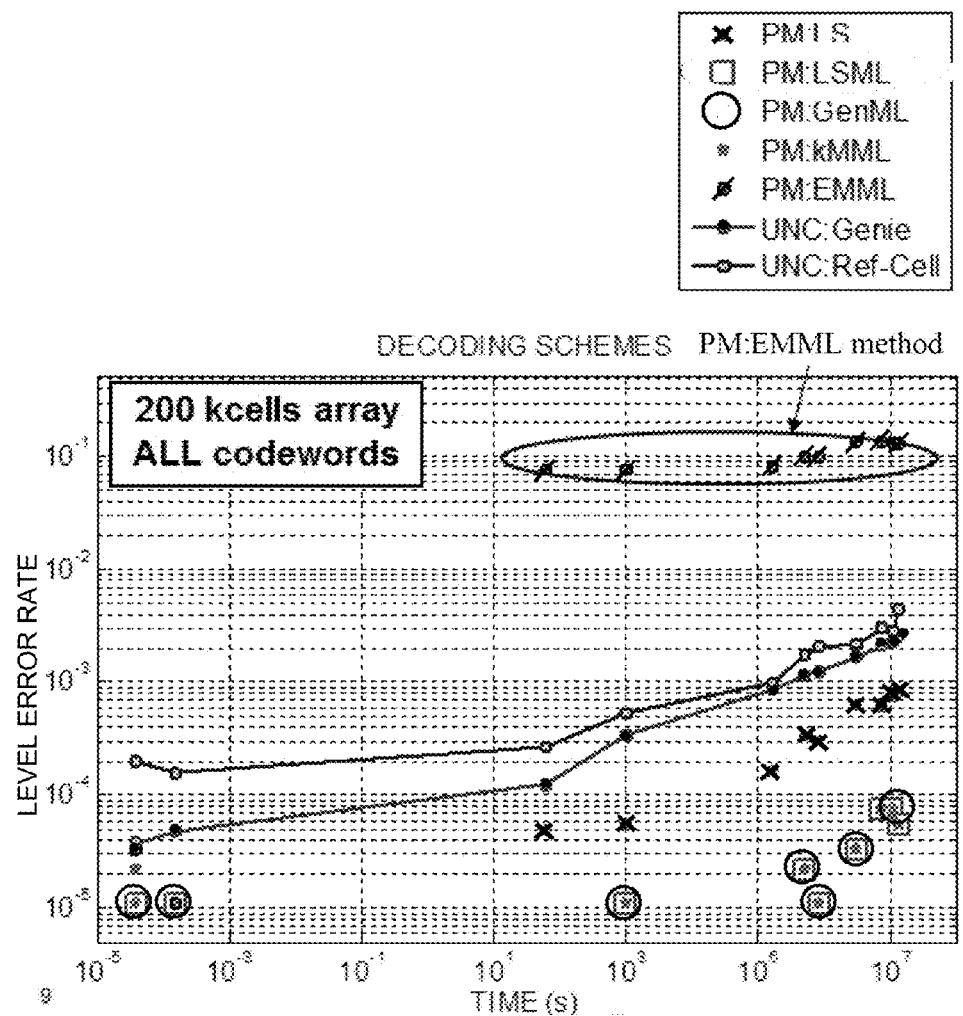
FIG. 7a shows a graph illustrating experimental results obtained with embodiments of the present invention.
Figure 7B:
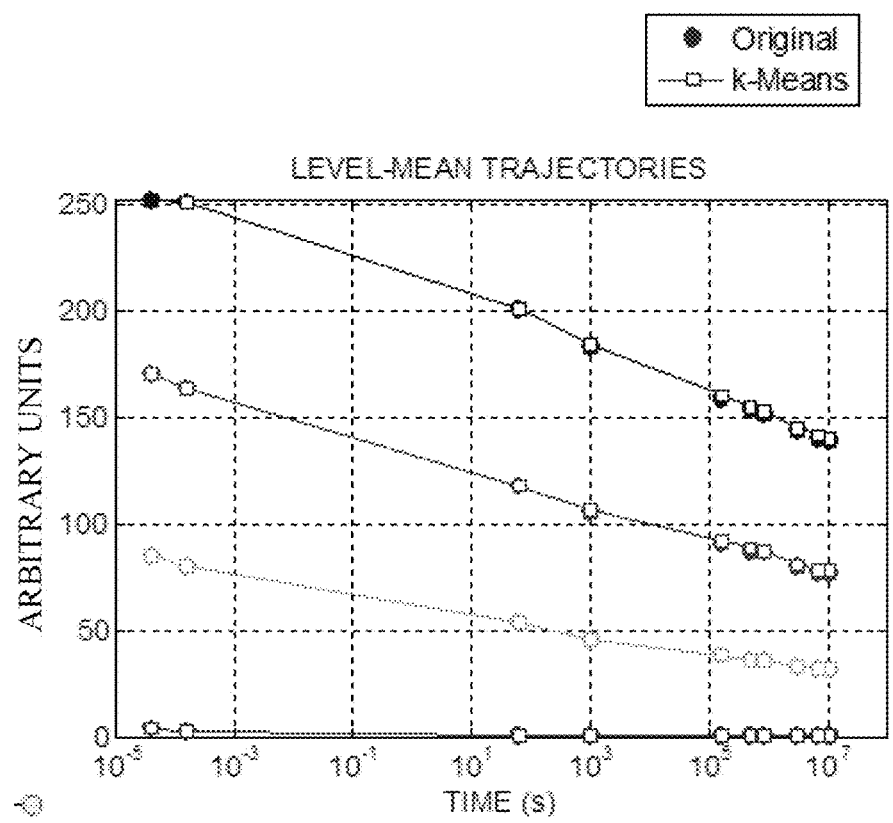
FIG. 7b shows the reference level trajectories over time according to an embodiment of the present invention.

FIGS. 7a and 7b illustrate experimental results comparing the detection methods of FIGS. 5 and 6 with other codeword detection techniques. The results were based on a PCM device with 200 kcells (1 kcell=1024 cells) all of which were used in the estimation process. Each cell was programmed with one of four possible levels (q=4). FIG. 7a plots the variation of level error rates with time for six different methods. FIG. 7b shows the reference level (mean) trajectories over time for the four cell levels calculated using a conventional k-means clustering algorithm ("k-Means") and the actual reference levels, calculated from perfect knowledge of the stored level in each cell ("Original"), the points being largely coincident with the two methods. In FIG. 7a, the trace labeled "UNC:Ref-Cell" was obtained with uncoded data (no modulation coding in encoder 3) using a reference-cell based technique with an overhead of 21.5% (which corresponds to the overhead for the modulation code used for the other methods illustrated). The trace labeled "UNC:Genie" was also obtained with uncoded data, but using a genie (i.e. an impractical detector that has perfect knowledge of all user cell data) to perform a model-based correction for drift. All other traces show results for coded data using the translation-stable permutation modulation (PM) code of FIG. 4 (code-rate=1.57 bits/cell). The trace labeled "PM:EMML" shows the results for coded data with a conventional expectation maximization algorithm employed for clustering read signals in codeword detection. The trace labeled "PM:LS" shows the results for coded data with the detection method for FIG. 5. The trace labeled "PM:LSML" shows the results for coded data with the detection method for FIG. 6. The trace labeled "PM:GenML" shows the results for coded data with the genie to perform model-based drift correction. The trace labeled "PM:kMML" shows the results for coded data with a conventional k-means clustering algorithm employed for clustering read signals in codeword detection. It can be seen from this figure that the FIG. 5 method gives good results, outperforming the EM method and both methods using uncoded data. The method for FIG. 6 gives excellent results. The performance is substantially identical to the k-means and genie-based methods. However, the genie is impractical, and the FIG. 6 method converges must faster than the k-means method. In particular, the k-means technique required, on average, 4.1 iterations to converge while the FIG. 6 method always converges in two steps as discussed above.

Figure 8:
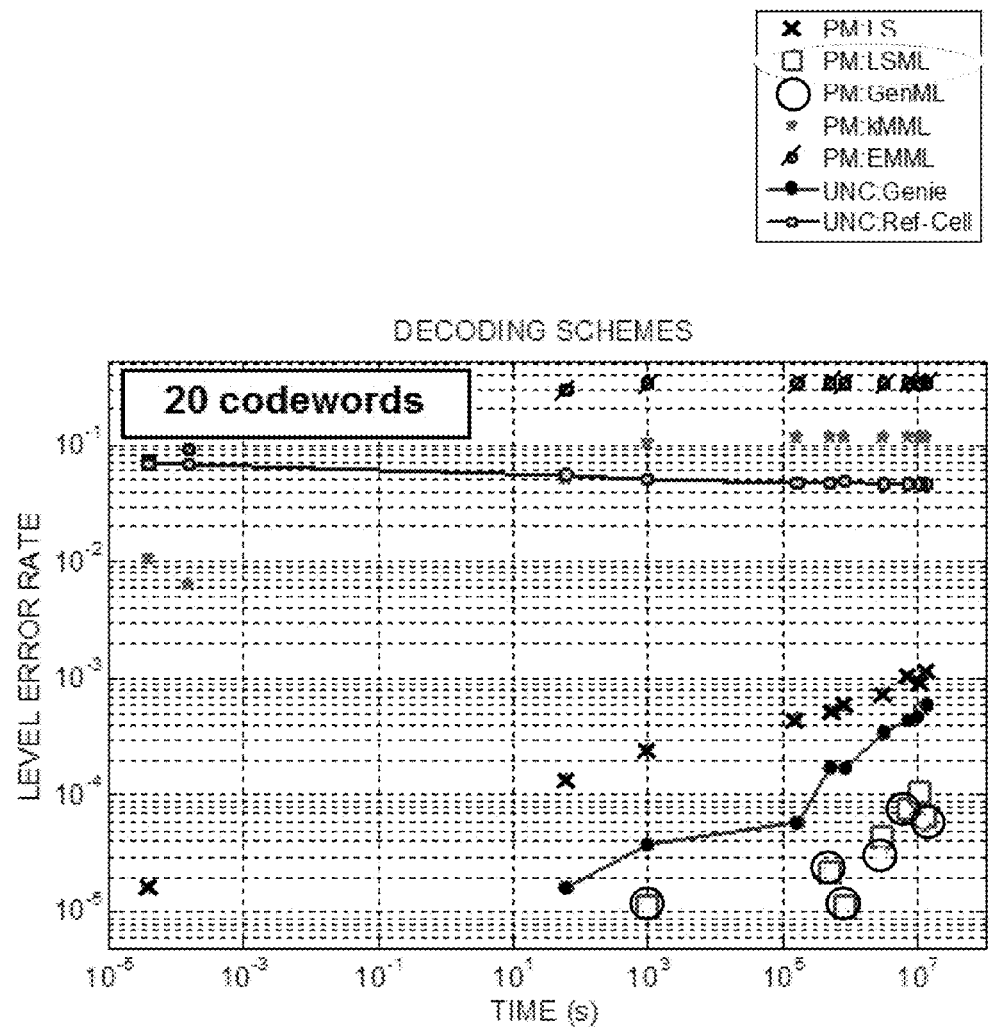
FIG. 8 shows experimental results for a smaller codeword group size according to an embodiment of the present invention.

FIG. 8 shows the results for B=20 codewords. As demonstrated in this figure, the methods of FIGS. 5 and 6 perform well even at small group sizes. The FIG. 6 method in particular gives almost identical performance to the genie-based estimator even with groups of only 20 codewords.

Figure 9A:
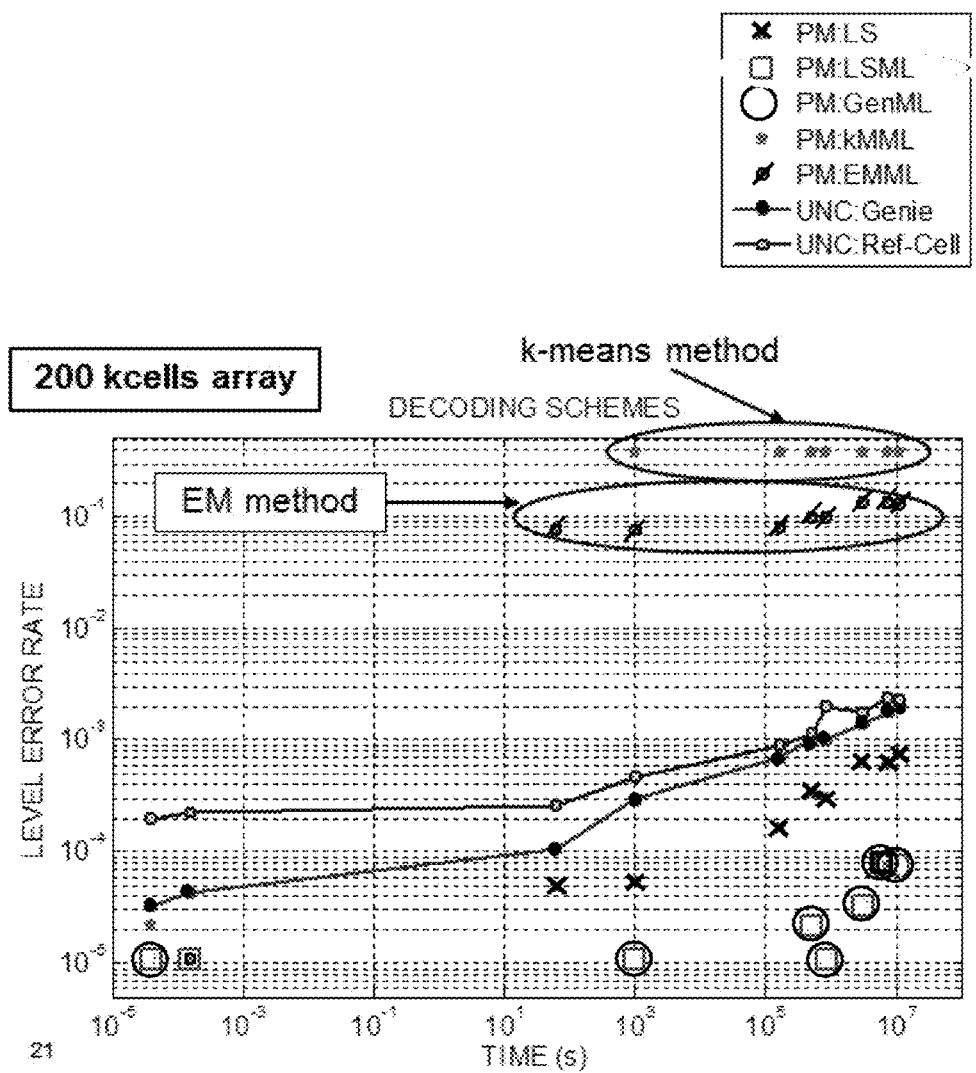
FIG. 9a shows an experimental result under different initialization conditions according to an embodiment of the present invention.
Figure 9B:
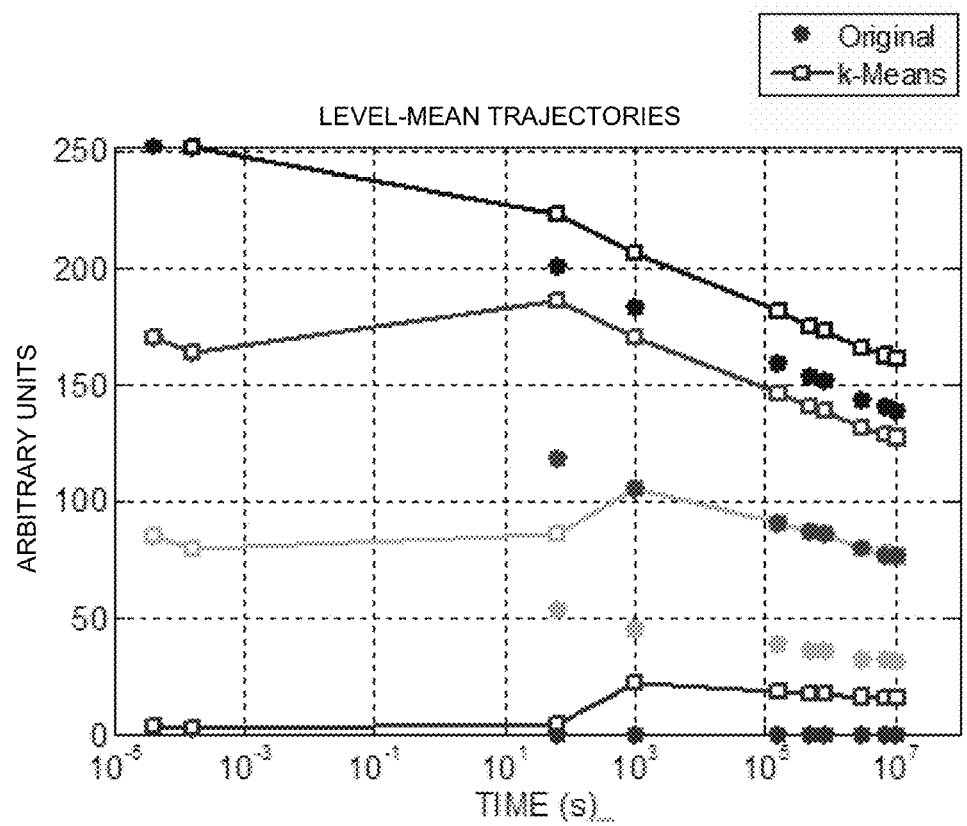
FIG. 9b shows another experimental result under different initialization conditions according to an embodiment of the present invention.

FIGS. 9a and 9b correspond generally to FIGS. 7a and 7b showing results for the same basic scenario but with different initialization conditions used for the k-means and EM methods. In particular, in FIGS. 7a and 7b, at each instant in time where reading of the cells occurs, both k-means and EM use as initialization the final estimates for the reference levels obtained from the previous time instant where reading of the cells was made. On the other hand, in FIGS. 9a and 9b, both k-means and EM are initialized with the target reference levels, which is the given target levels during writing of the cells. The latter scheme is more realistic, since the scheme of FIGS. 7a and 7b can require a separate memory area to store the reference level estimates from the previous memory readout. It can be seen that the k-means and EM methods are sensitive to initial conditions, both converging to local minima (see FIG. 9a) and giving bad performance. In contrast, the methods of FIGS. 5 and 6 are immune to initial conditions. The FIG. 6 method in particular performs as well as the genie-based scheme.

It will of course be appreciated that many changes and modifications can be made to the particular embodiments detailed above. For example, while the preferred embodiments use translation stable codes, other coding schemes (or even uncoded data) can be used where the overall set of codewords consists of permutations of one or more predefined vectors. Also, while memory 2 uses PCM cells, the techniques described can be applied to other multilevel solid state memory cells, such as flash memory cells, where similar considerations apply. Many other changes and modifications can be made to the above embodiments without departing from the scope of the invention.

What is claimed is:

1. A method for detecting codewords in solid-state storage devices, the method comprising the steps of:
    obtaining, by a processor of the computer system, respective read signals by reading memory cells that stores a group of N-symbol codewords, wherein each of said read signals comprises N signal components corresponding to respective symbols of said codeword;
    producing, by the processor, an ordered read signal by ordering said components of each of said read signals according to a signal level;
    producing, by the processor, an average read signal by averaging corresponding components of said ordered read signals;
    determining, by the processor, a reference signal level that corresponds to each of q levels of said memory cells in relation to said average read signal with predefined probabilities of each symbol value occurring at each symbol position in said codeword, wherein said symbols of said codeword are ordered according to said symbol value; and
    detecting, by the processor, said codeword corresponding to each of said read signal in relation to said reference signal levels;
    wherein each of said codewords is a permutation of an N-symbol vector in a predefined set of said N-symbol vectors;
    wherein each of said symbols of each said codeword has one of q symbol values; and
    wherein said symbols are stored in respective q-level cells of solid state memory, where N≥q>2.

2. The method according to claim 1, wherein:
    said symbols of said vector are ordered according to said symbol value; and
    said probabilities are related to said symbol values at each of said symbol position in said set of vectors.

3. The method according to claim 2, wherein:
    said set of said vectors comprises a plurality of said vectors; and
    said probabilities are dependent on the number of valid codewords that are permutations of each said vector.

4. The method according to claim 3, further comprising the steps of:
    defining a set of linear equations for said reference signal levels in relation to said average read signal and said predefined probabilities; and
    solving said set of linear equations to determine said reference signal levels.

5. The method according to claim 4, further comprising the step of:
    solving said set of linear equations by using a least-squares method.

6. The method according to claim 3, wherein said step of detecting said codeword corresponding to each of said read signal further comprises the steps of:
    producing a vector signal corresponding to each said vector by replacing each symbol of said vector with said reference signal level that corresponds to said symbol value; and
    identifying said vector by determining which vector signal is closest to said ordered read signal for said codeword.

7. The method according to claim 6, further comprising the step of:
    detecting each of said codeword by applying an inverse permutation to said vector identified for said codeword, wherein said inverse permutation is an inverse of said permutation of said read signal producing said ordered read signal for said codeword.

8. The method according to claim 6, further comprising the steps of:
    calculating statistical data for a distribution of said read signal component levels corresponding to each of said q levels of said memory cells from said ordered read signals and said vectors identified for said codewords corresponding thereto; and
    identifying said vector in relation to said ordered read signal for said codeword and said statistical data.

9. The method according to claim 8, wherein said vectors are identified in relation to said statistical data by using one of a maximum-a-posteriori detection method and a maximum-likelihood detection method.

10. The method according to claim 8, further comprising the steps of:
    detecting each of said codeword by applying an inverse permutation to vector identified; and
    using said statistical data for said codeword,
    wherein said inverse permutation is an inverse of said permutation of said read signal producing said ordered read signal for said codeword.

11. The method according to claim 1, wherein said N-symbol codewords are codewords of a translation stable code.

12. The method according to claim 1, wherein said group of codewords are read substantially simultaneously.

13. The method according to claim 1, wherein said group of said codewords comprises codewords written substantially simultaneously to said solid state memory.

14. An apparatus for detecting solid state storage devices, the apparatus comprising:
    a memory controller configured to obtain read signals by reading memory cells that store a group of codewords, wherein each of said read signal comprises N signal components corresponding to said symbols of said codeword; and
    a codeword detector configured to:
    produce an ordered read signal by ordering said components of each of said read signals according to a signal level;

produce an average read signal by averaging corresponding components of said ordered read signals;

determine a reference signal level that corresponds to each of q levels of said memory cells in relation to said average read signal with predefined probabilities of each symbol value occurring at each symbol position in said codeword, wherein said symbols of said codeword are ordered according to said symbol value; and detect said codeword corresponding to each of said read signal in relation to said reference signal levels;

wherein each of said codewords is a permutation of an N-symbol vector in a predefined set of said N-symbol vectors;

wherein each of said symbols of each said codeword has one of q symbol values; and wherein said symbols are stored in respective q-level cells of solid state memory, where $N \geq q > 2$.

15. A solid-state storage device, comprising:

a solid-state memory having q-level cells, wherein $q > 2$;

a writing apparatus for writing N-symbol codewords in said solid-state memory where $N \geq q$;

wherein each of said N-symbol codewords is a permutation of an N-symbol vector of a predefined set of said N-symbol vectors;

wherein said each of said symbols of each said codeword has one of q symbol values; and wherein said symbols are stored in respective q-level cells; and a codeword detector configured to:

produce an ordered read signal by ordering said components of each of said read signals according to a signal level;

produce an average read signal by averaging corresponding components of said ordered read signals;

determine a reference signal level that corresponds to each of q levels of said memory cells in relation to said average read signal with predefined probabilities of each symbol value occurring at each symbol position in said codeword, wherein said symbols of said codeword are ordered according to said symbol value; and detect said codeword corresponding to each of said read signal in relation to said reference signal levels.

* * * * *